United States Patent
Kang et al.

(10) Patent No.: US 11,808,795 B2
(45) Date of Patent: Nov. 7, 2023

(54) PROGNOSTIC METHOD AND APPARATUS FOR IMPROVING CIRCUIT HEALTH

(71) Applicant: AGENCY FOR DEFENSE DEVELOPMENT, Daejeon (KR)

(72) Inventors: Tae Yeob Kang, Daejeon (KR); Donghwan Seo, Daejeon (KR)

(73) Assignee: AGENCY FOR DEFENSE DEVELOPMENT, Daejeon (KR)

( * ) Notice: Subject to any disclaimer, the term of this patent is extended or adjusted under 35 U.S.C. 154(b) by 0 days.

(21) Appl. No.: 17/572,133

(22) Filed: Jan. 10, 2022

(65) Prior Publication Data
US 2022/0221497 A1    Jul. 14, 2022

(30) Foreign Application Priority Data
Jan. 11, 2021  (KR) .......................... 10-2021-0003562

(51) Int. Cl.
*G01R 23/02*    (2006.01)

(52) U.S. Cl.
CPC .................................. *G01R 23/02* (2013.01)

(58) Field of Classification Search
CPC ........ G01R 23/02; G01R 23/07; G01R 23/08; G01R 23/005; G01R 23/15; G01R 23/16; G01R 27/00; G01R 27/02; G01R 27/06; G01R 27/26; G01R 27/28; G01R 27/2623; G01R 27/2658; G01R 27/2688; G01R 31/28; G01R 31/2832; G01R 31/2836; G01R 31/2812; G01R 31/2837; G01R 31/2824; G01V 3/101
See application file for complete search history.

(56) References Cited

U.S. PATENT DOCUMENTS

| | | | |
|---|---|---|---|
| 7,441,140 B2 | 10/2008 | Hayashi | |
| 8,103,463 B2 | 1/2012 | Kalgren et al. | |
| 2002/0133790 A1* | 9/2002 | Harada | G06F 30/367 |
| | | | 716/107 |
| 2005/0127892 A1* | 6/2005 | Kahng | G01R 27/28 |
| | | | 324/76.12 |
| 2006/0070017 A1* | 3/2006 | Hayashi | G06F 11/2028 |
| | | | 714/E11.111 |
| 2008/0141072 A1* | 6/2008 | Kalgren | G01D 3/08 |
| | | | 714/33 |
| 2009/0257537 A1 | 10/2009 | Kim et al. | |

(Continued)

FOREIGN PATENT DOCUMENTS

| | | |
|---|---|---|
| JP | 2006-85555 | 3/2006 |
| KR | 10-2009-0107631 | 10/2009 |
| KR | 10-2136863 | 7/2020 |

OTHER PUBLICATIONS

Office Action dated May 9, 2023 for Korean Patent Application No. 10-2021-0003562 and its English translation provided by Applicant's foreign counsel.

*Primary Examiner* — Son T Le
*Assistant Examiner* — Matthew W. Baca
(74) *Attorney, Agent, or Firm* — Ladas & Parry, LLP

(57) ABSTRACT

Disclosed are a method and an apparatus for improving circuit health. The method includes obtaining an S-parameter plot of a circuit having an input port and an output port; determining a resonance frequency of the circuit based on the S-parameter plot; and estimating the health of the circuit based on the resonance frequency.

10 Claims, 18 Drawing Sheets

(56) References Cited

U.S. PATENT DOCUMENTS

| | | | |
|---|---|---|---|
| 2012/0232814 A1* | 9/2012 | Hofmeister | G01R 31/40 702/60 |
| 2016/0035545 A1* | 2/2016 | Baek | H01J 37/32807 702/57 |
| 2019/0186380 A1* | 6/2019 | Dardona | F02C 9/00 |

* cited by examiner

PROGNOSTIC METHOD AND APPARATUS FOR IMPROVING CIRCUIT HEALTH

CROSS-REFERENCE TO RELATED APPLICATION

This application is based on and claims priority under 35 U.S.C. § 119 to Korean Patent Application No. 10-2021-0003562, filed on Jan. 11, 2021, in the Korean Intellectual Property Office, the disclosure of which is incorporated by reference herein in its entirety.

BACKGROUND

1. Field

One or more embodiments relate to a method and an apparatus for improving circuit health, and more particularly, to a method and an apparatus for improving the health of a circuit to be analyzed based on an S-parameter plot.

2. Description of Related Art

In order to improve the reliability of circuits, parts, devices and systems, prognostics and health management (PHM) technique for estimating a target lifespan, a maintenance management cycle, and a remaining operating time is being used in various fields. In particular, it is very important to effectively apply such a PHM technique to weapon systems and communication equipment that may cause damage to a large number of people when operation is stopped due to a failure or a defect. For example, when a defect occurs in a radar operated by the military during a war and the operation thereof is stopped, the detection capability of the military is deteriorated and the overall operational performance may be significantly compromised. Therefore, it is necessary to improve the reliability of corresponding circuits, parts, device, and systems by using an effective PHM technique.

The PHM technique is a technique for preventing unexpected failures by diagnosing a failure of machine equipment in advance and determining an appropriate maintenance time. For example, when key parts dependent on overseas repair fail, it may take time to secure parts and repair personnel, and thus the repair time may be increased. However, by applying the PHM technique, it is possible to predict the expected failure time of key parts and to organize delivery of parts and repair personnel in advance, thereby reducing the repair time. Therefore, synergistic effects like system operation rate improvement, quality improvement, productivity improvement, and energy efficiency improvement may be expected.

The PHM technique includes four stages: a data obtaining stage, a characteristic factor extracting stage, a health estimating stage, and a decision-making stage. First, an optimal database may be built through analyses of system design characteristics, operating conditions, and maintenance history in the data obtaining stage. Also, atypical data may be collected based on experience-based and statistical approaches. In the characteristic factor extracting stage, unnecessary noise is removed from the previously obtained data, and factors highly correlated with system failure and health are extracted. A current system state and a future state (remaining life) are calculated by using the characteristic factors extracted earlier in the health estimating stage.

As a characteristic factor for estimating and managing the health of an electronic circuit, a resistance or impedance measured from a device or an interconnection is used previously. In the case of a method of measuring a resistance, since a change in resistance may be measured after a defect occurs, it is impossible to estimate and eliminate or prepare for a defect in advance. In the case of a method of measuring impedance, impedance is calculated by using a resistance, a capacitance, and an inductance, which shows a large change in a low frequency region. While the method is useful for detecting a defect of a relatively large circuit or system (e.g., an electric motor, a generator, a turbine, etc.), the method is not sensitive to small changes. Therefore, it is difficult to identify defects or damage occurring in small-sized circuits.

SUMMARY

One or more embodiments provide a method of improving health of a circuit based on an S-parameter plot.

One or more embodiments provide an apparatus for improving health of a circuit based on an S-parameter plot.

One or more embodiments provide an electronic device that determines the remaining lifespan of a circuit by using the apparatus for improving circuit health and replaces a circuit based on the remaining lifespan.

Additional aspects will be set forth in part in the description which follows and, in part, will be apparent from the description, or may be learned by practice of the presented embodiments of the disclosure.

According to one or more embodiments, a method of improving circuit health, the method includes obtaining an S-parameter plot of a circuit having an input port and an output port; determining a resonance frequency of the circuit based on the S-parameter plot; and estimating the health of the circuit based on the resonance frequency.

The method may further include obtaining a first resonance frequency when the circuit is in a fresh state; and obtaining a second resonance frequency when the circuit is in an old state, wherein the estimating of the health of the circuit may include estimating remaining lifespan of the circuit based on the first resonance frequency, the second resonance frequency, and the resonance frequency.

The remaining lifespan of the circuit to be analyzed may be estimated based on a ratio between a difference between the resonance frequency and the second resonance frequency and a difference between the first resonance frequency and the second resonance frequency.

The obtaining of the second resonance frequency when the circuit is in the old state may include obtaining a resonance frequency of the circuit after repeatedly applying a chemical, physical, or thermal stimulation to the circuit a pre-set number of times.

The obtaining of the S-parameter plot of the circuit may include obtaining a plot regarding a reflection coefficient, which is a ratio between a reflected wave and an incident wave of the input port, obtaining a plot regarding a reverse transfer coefficient, which is a ratio between the reflected wave of the input port and an incident wave of the output port, obtaining a plot regarding a transfer coefficient, which is a ratio between a reflected wave of the output port and an incident wave of the input port, or obtaining a plot regarding a reflection coefficient, which is a ratio between the reflected wave and the incident wave of the output port.

The determining of the resonance frequency of the circuit may include determining a frequency having a maximum value or a minimum value in a pre-set frequency band in the S-parameter plot as the resonance frequency.

According to one or more embodiments, an apparatus for estimating health of a circuit to be analyzed by using an S-parameter plot analysis. The apparatus includes a memory; an S-parameter measurer configured to obtain an S-parameter plot of a circuit to be analyzed having an input port and an output port and store data regarding the S-parameter plot in the memory; and at least one processor configured to determine a resonance frequency of the circuit to be analyzed based on the data regarding the S-parameter plot stored in the memory and estimate health of the circuit to be analyzed based on the resonance frequency.

The processor may be configured to estimate the remaining lifespan of the circuit to be analyzed based on a first resonance frequency when the circuit to be analyzed is in a fresh state, a second resonance frequency when the circuit to be analyzed is in an old state, and the resonance frequency.

The remaining lifespan of the circuit to be analyzed may be estimated based on a ratio between a difference between the resonance frequency and the second resonance frequency and a difference between the first resonance frequency and the second resonance frequency.

The second resonance frequency Fp2 may be a resonance frequency of the circuit to be analyzed obtained by repeatedly applying a chemical, physical, or thermal stimulation to the circuit for a pre-set number of times.

The resonance frequency of the circuit to be analyzed may be a frequency having a maximum value or a minimum value in a pre-set frequency band in the S-parameter plot of the circuit to be analyzed.

According to one or more embodiments, an electronic device includes a plurality of circuits connected in parallel; an apparatus for improving circuit health configured to evaluate circuit health of the plurality of circuits and applying a replacement signal based on a result of the evaluation; a switch circuit configured to receive the replacement signal and select one of the plurality of circuits; and a power supply configured to supply power to one circuit selected by the switch circuit, wherein the apparatus for improving circuit health includes a memory; an S-parameter measurer configured to obtain an S-parameter plot of a circuit to be analyzed having an input port and an output port and store data regarding the S-parameter plot in the memory; and at least one processor configured to determine a resonance frequency of the circuit to be analyzed based on the data regarding the S-parameter plot stored in the memory and estimate health of the circuit to be analyzed based on the resonance frequency.

The apparatus for improving circuit health may estimate the remaining lifespan of the circuit to be analyzed based on a first resonance frequency when the circuit to be analyzed is in a fresh state, a second resonance frequency when the circuit to be analyzed is in an old state, and the resonance frequency, and, when the remaining lifespan of the circuit to be analyzed is less than or equal to a pre-set value, apply a replacement command to the switch circuit.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
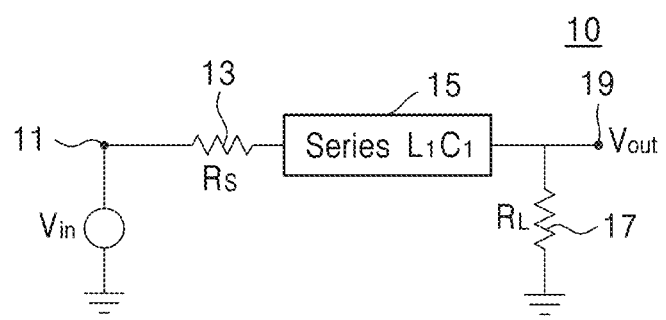
FIG. 1 is a circuit diagram showing a serial LC circuit.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

While one or more embodiments are susceptible to various modifications and variations, specific embodiments thereof are illustrated in the drawings and will be described in detail hereinafter. However, it is not intended to limit one or more embodiments to the particular forms disclosed herein. Rather, one or more embodiments include all modifications, equivalents, and substitutions consistent with the technical spirit of one or more embodiments as defined by the claims.

It will be understood that when an element, such as a layer, region, or substrate, is referred to as being "on" another component, it may be directly on the other element or an intervening elements may be therebetween.

Although the terms first, second, etc. may be used to describe various elements, components, regions, layers, and/or regions, It will be understood that such elements, components, regions, layers, and/or regions, should not be limited by these terms.

With reference to the accompanying drawings, one or more embodiments will be described in more detail. Hereinafter, the same reference numerals are used to denote the same components in the drawings, and repeated descriptions of the same components are omitted.

FIG. 1 is a circuit diagram showing a serial LC circuit.

Referring to FIG. 1, a serial LC circuit 10 includes an input port 11, an input impedance 13, an inductor-capacitor connection element 15, an output impedance 17, and an output port 19.

Scattering parameters (S-parameters) are used as a value indicating a transfer characteristic from one stage to a next stage in a cascade system. In the serial LC circuit 10 shown in FIG. 1, an input voltage $V_{in}$ is input to the input port 11, and an output voltage $V_{out}$ is output from an output port 19. The inductance of the inductor-capacitor connection element 15 is $L_1$, the capacitance is $C_1$, the input impedance 13 is $R_S$, and the output impedance 17 is $R_L$.

When the frequency of the input voltage $V_{in}$ input to the input port 11 is $$\omega = \frac{1}{\sqrt{L_1 C_1}},$$

the inductor-capacitor connection element 15 is short-circuited, and thus the output voltage $V_{out}$ output from the output port 19 has a maximum value. When the frequency of the input voltage $V_{in}$ has a value different from the above-stated value, voltage attenuation occurs by the inductor-capacitor connection element 15. In this case, the attenuating voltage may be understood as a reflected wave. In other words, the characteristics of a device may be expressed by using a ratio of an input signal to the input port 11 of the serial LC circuit 10 with respect to an output signal from the output port 19.

Figure 2:
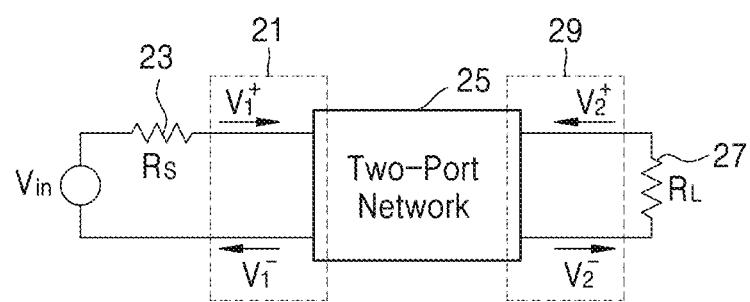
FIG. 2 is a circuit diagram showing components of a generalized two-terminal circuit.

FIG. 2 is a circuit diagram showing components of a generalized two-terminal circuit.

The serial LC circuit 10 having the inductor-capacitor connection element 15 shown in FIG. 1 may be more generalized and shown as a two-terminal circuit 20 including various elements.

Referring to FIG. 2, the two-terminal circuit 20 may include an input port 21, an input impedance 23, an element network 25, an output impedance 27, and an output port 29.

An incident wave and a reflected wave measured at the input port 21 may be expressed as $V_1^+$ and $V_1^-$, respectively, and an incident wave and a reflected wave measured at the output port 29 may be expressed as $V_2^+$ and $V_2^-$, respectively. At this time, the incident wave $V_1^+$ measured at the input port 21 is a signal generated by the input voltage $V_{in}$ when the input impedance 23 is $R_S$, and the reflected wave $V_1^-$ measured at the input port 21 is a signal generated by the input voltage $V_{in}$ when the input impedance 23 is not $R_S$. The incident wave $V_2^+$ measured at the output port 29 may be considered as a signal incident on the output impedance 27 or equivalently reflected by the output impedance 27.

The incident wave and the reflected wave measured at the input port 21 and the incident wave and the reflected wave measured at the output port 29 may be expressed by below equations using an S-parameter.

$V_1^- = S_{11}V_1^+ + S_{12}V_2^+$ $V_2^- = S_{21}V_1^+ + S_{22}V_2^+$

Figure 3:
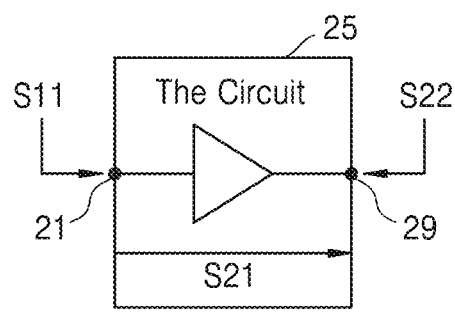
FIG. 3 is a conceptual diagram for describing the S-parameters of the two-terminal circuit shown in FIG. 2.

FIG. 3 is a conceptual diagram for describing the S-parameters of the two-terminal circuit shown in FIG. 2.

Referring to FIG. 3, $S_{11}$ denotes a ratio between the incident wave and the reflected wave at the input port 21 of the two-terminal circuit 20, $S_{12}$ denotes a ratio between the reflected wave at the input port 21 and the incident wave at the output port 29, and $S_{22}$ denotes a ratio between the reflected wave at the output port 29 and the incident wave at the input port 21.

$S_{11}$ is the ratio between the reflected wave and the incident wave measured at the input port 21 when a value reflected by the output impedance 27 $R_L$ of the two-terminal circuit 20 is '0'.

$$S_{11} = \frac{V_1^-}{V_1^+} \text{ when } V_2^+ = 0$$

$S_{11}$ is a value indicating the matching accuracy of the input port 21 and refers to the reflection coefficient of the input port 21.

$S_{12}$ is the ratio between the reflected wave measured at the input port 21 and the incident wave measured at the output port 29 when a value reflected by the input impedance 23 $R_S$ of the two-terminal circuit 20 is '0'.

$$S_{12} = \frac{V_2^-}{V_1^+} \text{ when } V_1^+ = 0$$

$S_{12}$ refers to a reverse isolation coefficient of the two-terminal circuit 20 indicating the influence of an output signal on the input port 21.

$S_{22}$ is the ratio between the reflected wave and the incident wave at the output port 29 when the value reflected by the input impedance 23 $R_S$ is '0'.

$$S_{22} = \frac{V_2^-}{V_2^+} \text{ when } V_1^+ = 0$$

$S_{22}$ is a value indicating the matching accuracy of the output port 29 and refers to the reflection coefficient of the output port 29.

$S_{21}$ is the ratio between the incident wave at the input port 21 and the reflected wave at the output port 29 when a value reflected by the output impedance 27 is '0'.

$$S_{21} = \frac{V_2^-}{V_1^+} \text{ when } V_2^+ = 0$$

$S_{21}$ refers to a transfer coefficient expressing the gain of the two-terminal circuit 20.

As described above, in the case of the two-terminal circuit 20, unique characteristics of the two-terminal circuit 20 may be expressed by using S-parameters $S_{11}$, $S_{12}$, $S_{22}$, and $S_{21}$.

Figure 4:
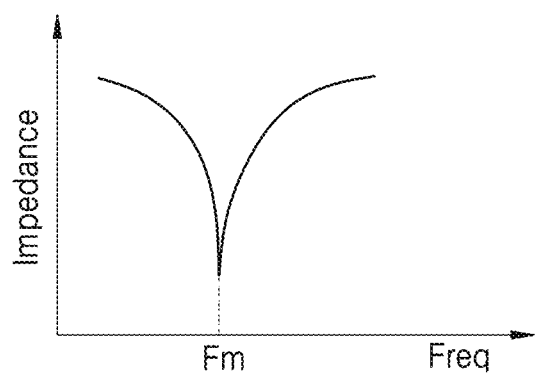
FIG. 4 is a graph for describing the intrinsic impedance of the two-terminal circuit shown in FIG. 2.

FIG. 4 is a graph for describing the intrinsic impedance of the two-terminal circuit shown in FIG. 2.

Referring to FIG. 4, it may be seen that the intrinsic impedance of the two-terminal circuit 20 changes according to frequency values. In the case of a capacitor, the impedance thereof decreases as the frequency of an applied signal increases. On the contrary, in the case of an inductor, the impedance thereof increases as the frequency of an applied signal increases. Since the two-terminal circuit 20 includes an element network 25 consisting of a combination of capacitors, inductors, or resistors, the impedance of the two-terminal circuit 20 also changes according to the frequency value of an applied signal.

Since the ratio between an incident wave and a reflected wave changes according to a change of impedance, S-parameters are also affected by the frequency value. For example, when an input impedance according to the frequency value of a particular circuit or connection is as shown in FIG. 4, the input impedance has a minimum value at a matching frequency value Fm. At this time, from among the S-parameters of the simple two-terminal circuit 20, the reflection coefficient $S_{11}$ of the input port 21 has the minimum value and the transmission coefficient $S_{21}$ has the maximum value at the matching frequency value Fm. At frequencies other than the matching frequency value Fm, the reflection coefficient $S_{11}$ of the input port 21 increases, and the transmission coefficient $S_{21}$ decreases. In the case of a two-terminal circuit or connection having a complicated configuration, frequency characteristics of the S-parameters become more complicated due to parasitic components, signal line effects, etc. As the frequency characteristics become more complicated, a significant difference may be confirmed even with a small change.

Figure 5:
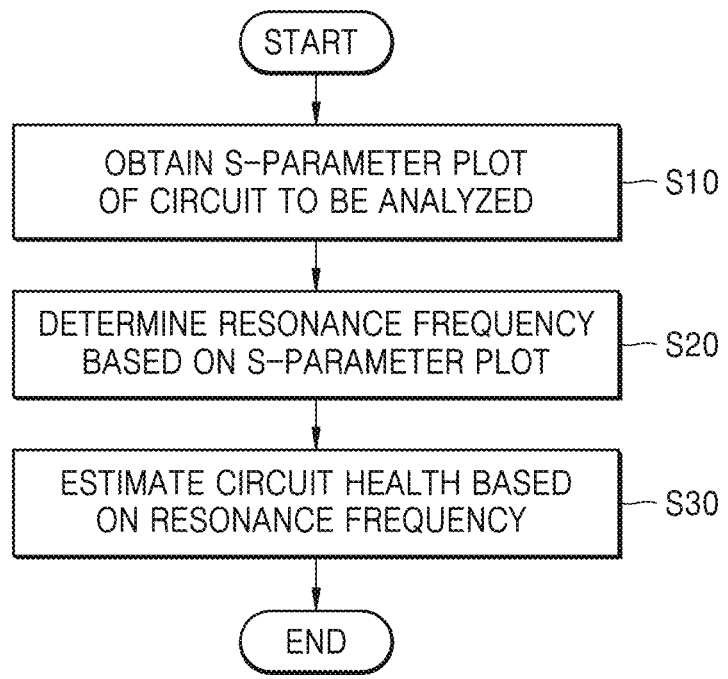
FIG. 5 is a flowchart of a method of improving circuit health according to an embodiment.

FIG. 5 is a flowchart of a method of improving circuit health according to an embodiment.

Referring to FIG. 5, the method of improving circuit health according to an embodiment includes operation S10 of obtaining an S-parameter plot of a circuit to be analyzed, operation S20 of determining a resonance frequency Fp based on the S-parameter plot, and operation S30 of estimating circuit health based on the resonance frequency Fp.

In operation S10 of obtaining the S-parameter plot of the circuit to be analyzed, S-parameters are obtained by measuring incident waves and reflected waves at an input port, an output port, or the input port and the output port of circuit to be analyzed. By storing S-parameter values obtained by varying the frequency, an S-parameter plot is obtained with frequency values and the intensity of the S-parameters as respective axes.

In an embodiment, the S-parameter plot may be a plot of the reflection coefficient $S_{11}$ of the circuit to be analyzed obtained by measuring a ratio between a reflected wave and an incident wave of an input port.

In an embodiment, the S-parameter plot may be a plot of the reverse transfer coefficient $S_{12}$ of the circuit to be analyzed obtained by measuring a ratio between a reflected wave of the input port and an incident wave of an output port.

In an embodiment, the S-parameter plot may be a plot of the transfer coefficient $S_{21}$ of the circuit to be analyzed obtained by measuring a ratio between a reflected wave of the output port and an incident wave of the input port.

In another embodiment, the S-parameter plot may be a plot of the reflection coefficient $S_{22}$ of the circuit to be analyzed obtained by measuring a ratio between a reflected wave and an incident wave of the output port.

A plurality of S-parameter plots may be obtained by measuring any one or more of the plot of the reflection coefficient $S_{11}$ of the input port, the plot of the reverse transfer coefficient $S_{12}$, the plot of the transfer coefficient $S_{21}$, and the plot of the reflection coefficient $S_{22}$ of the output port and may be used to estimate the health of a circuit.

In operation S20 of determining the value of the resonance frequency Fp based on the S-parameter plots, the value of the resonance frequency Fp having a local minimum value or a local maximum value in a certain range from the S-parameter plots of the circuit to be analyzed.

As described above, S-parameters may exhibit a complex variation pattern depending on the frequency due to a connection, a capacitor, an inductor, a parasitic component, and a signal line effect of the circuit to be analyzed.

A particular range exhibiting the most sensitive change to mechanical, chemical, and thermal damage of the circuit to be analyzed is selected, and the resonance frequency Fp, which is a local minimum value or a local maximum value of the particular range, is determined.

In operation S30 of estimating circuit health based on the resonance frequency Fp, a current circuit health of the circuit to be analyzed is determined by comparing a current resonance frequency Fp of the circuit to be analyzed with a change pattern of the resonance frequency Fp of S-parameters of the circuit to be analyzed measured in advance.

As the frequency characteristics of S-parameters become more complicated, a significant difference occurs even with a small change in the circuit to be analyzed. The trend of such frequency changes of S-parameter may be organized into data and, based on the data, the health of a circuit to be analyzed may be quantitatively estimated.

Figure 6:
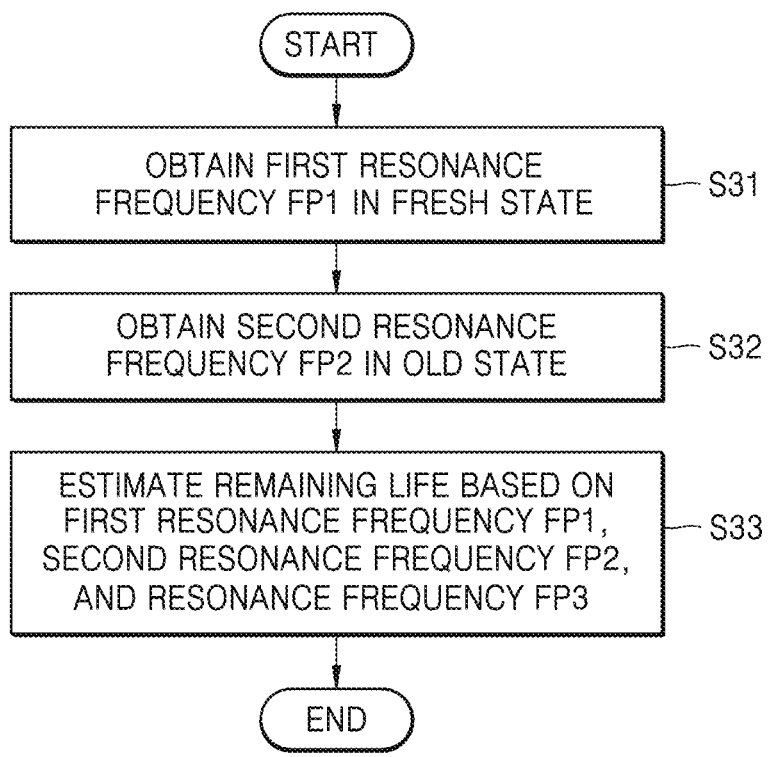
FIG. 6 is a flowchart showing the operation of estimating circuit health shown in FIG. 5 in detail.

FIG. 6 is a flowchart showing the operation of estimating circuit health shown in FIG. 5 in detail.

Referring to FIG. 6, operation S30 of estimating circuit health includes operation S31 of obtaining a first resonance frequency Fp1 in a fresh state, operation S32 of obtaining a second resonance frequency Fp2 in an old state, and operation S33 of estimating the remaining lifespan the first resonance frequency Fp1, the second resonance frequency Fp2, and a current resonance frequency Fp3.

In operation S31 of obtaining the first resonance frequency Fp1 in the fresh state, an S-parameter plot of a circuit, which is identical to the circuit to be analyzed and is without mechanical, chemical, or thermal damage after being manufactured, and the first resonance frequency Fp1, which is a local minimum value or a local maximum value of a certain range.

The first resonance frequency Fp1 may be calculated by measuring a circuit identical to a circuit to be analyzed for a plurality of number of times or by averaging resonance frequencies Fp1 obtained by measuring a plurality of circuits.

In operations S32 of obtaining second resonance frequency Fp2 in the old state, after chemical, physical, or thermal stimulation is repeatedly applied to the circuit, from which the first resonance frequency Fp1 is measured in the fresh state, for a pre-set number of times, an S-parameter plot of the circuit is obtained, and the second resonance frequency Fp2, which is a local minimum value or a local maximum value of a certain range, is obtained.

In an embodiment, after a chemical, mechanical, or thermal stimulation that may occur as the circuit is used is repeatedly applied to the circuit from which the first resonance frequency Fp1 is measured in the fresh state, an S-parameter plot of the circuit is obtained, and the second resonance frequency Fp2 is obtained based on the S-parameter plot.

Alternatively, in another embodiment, after driving a circuit for a pre-set time interval in an environment similar to a system to which the circuit is actually applied, an S-parameter plot is obtained, and, based on the S-parameter plot, the second resonance frequency Fp2 is obtained. As described above, the second resonance frequency Fp2 may be an average value obtained by measuring a plurality of number of times.

The first resonance frequency Fp1 and the second resonance frequency Fp2 may be obtained in advance and stored in a memory and may be values partially corrected from experimental values by analyzing design characteristics, operating conditions, and maintenance history of a system.

In operation S33 of estimating the remaining lifespan based on the first resonance frequency Fp1, the second resonance frequency Fp2, and the current resonance frequency Fp3, the remaining lifespan of the circuit to be analyzed is estimated by comparing the first resonance frequency Fp1 and the second resonance frequency Fp2 obtained and stored in advance with the current resonance frequency Fp3 of the circuit to be analyzed.

The remaining lifespan of the circuit to be analyzed may be a quantitative value indicating the current health of the circuit to be analyzed based on data regarding the circuit to be analyzed in the fresh state and the circuit to be analyzed in the old state.

For example, the remaining lifespan of the circuit to be analyzed may be estimated based on a ratio between a difference Fp–Fp2 between the resonance frequency Fp and the second resonance frequency Fp2 and a difference Fp1–Fp2 between the first resonance frequency Fp1 and the second resonance frequency Fp2.

Therefore, the health of the circuit to be analyzed may be measured as a quantitative value, and the malfunction probability of the circuit to be analyzed may be measured according to the remaining lifespan of the circuit to be analyzed and matched to the quantitative value. By using this, a circuit to be analyzed may be replaced or a repair schedule may be set before the circuit to be analyzed fails, thereby improving the reliability and the operation rate of a system including the circuit to be analyzed.

Figure 7:
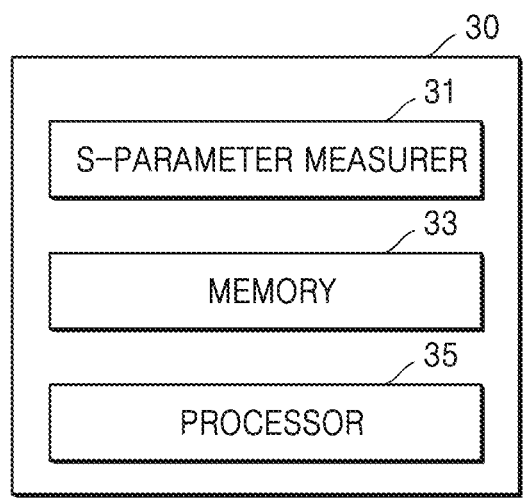
FIG. 7 is a diagram showing an apparatus for improving circuit health according to an embodiment.

FIG. 7 is a diagram showing an apparatus for improving circuit health according to an embodiment.

Referring to FIG. 7, an apparatus 30 for improving circuit health according to an embodiment includes an S-parameter measurer 31, a memory 33, and a processor 35.

The S-parameter measurer 31 obtains an S-parameter plot of a circuit to be analyzed having an input port and an output port and stores the S-parameter plot in the memory 33.

The S-parameter measuring device 31 may be connected to an input port, an output port, or both the input port and the output port of the circuit to be analyzed and measure an incident wave and a reflected wave of each port and store a ratio between the incident wave and the reflected wave.

According to an embodiment, the S-parameter measurer 31 may be connected to an input port of a circuit to be analyzed, measure a reflection coefficient of the input port, and obtain an S-parameter plot.

According to an embodiment, the S-parameter measurer 31 may be connected to an input port and an output port of a circuit to be analyzed, measure a reverse transfer coefficient or a transfer coefficient, and obtain an S-parameter plot.

Alternatively, the S-parameter measurer 31 may be connected to an output port of a circuit to be analyzed, measure a reflection coefficient of the output port, and obtain an S-parameter plot.

The memory 33 stores an S-parameter plot data obtained by the S-parameter measurer 31. The memory 33 may store various data for estimating circuit health. For example, the memory 33 may store S-parameter plots or resonance frequencies Fp1 and Fp2 of a circuit to be analyzed in a fresh state and an old state and may store input data or output data regarding software and related commands.

The memory 33 may be a computer-readable recording medium and may include a storage medium like a magnetic storage medium (e.g., a ROM, a floppy disk, a hard disk, etc.) and an optically readable medium (e.g., a CD-ROM, a DVD, etc.).

The processor 35 may be configured to determine the resonance frequency Fp of the circuit to be analyzed based on data regarding S-parameter plots in the memory 33 and estimate the health of the circuit to be analyzed based on the resonance frequency Fp.

The processor 35 estimates the remaining lifespan of the circuit to be analyzed based on the first resonance frequency Fp1 when the circuit to be analyzed is in the fresh state, the second resonance frequency Fp2 when the circuit to be analyzed is in the old state, and the resonance frequency Fp, wherein the first resonance frequency Fp1, the second resonance frequency Fp2, and the resonance frequency Fp are stored in the memory 33.

The remaining lifespan of the circuit to be analyzed may be quantitatively estimated based on a ratio between a difference Fp–Fp2 between the resonance frequency Fp and the second resonance frequency Fp2 and a difference Fp1–Fp2 between the first resonance frequency Fp1 and the second resonance frequency Fp2.

The second resonance frequency Fp2 may be a resonance frequency of the circuit to be analyzed obtained by repeatedly applying a chemical, physical, or thermal stimulation to the circuit for a pre-set number of times.

The processor 35 may be configured to be included in other hardware devices, such as a microprocessor or general purpose computer system.

According to an embodiment, the S-parameter measurer 31, the memory 33, and the processor 35 may be embedded in a circuit to be analyzed or an electronic device to be analyzed to configure an embedded system.

Figure 8A:
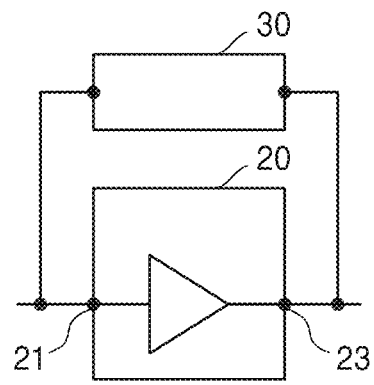
FIG. 8A, FIG. 8B and FIG. 8C are diagrams showing various embodiments of connecting an apparatus for improving circuit health to a circuit to be analyzed.
Figure 8B:
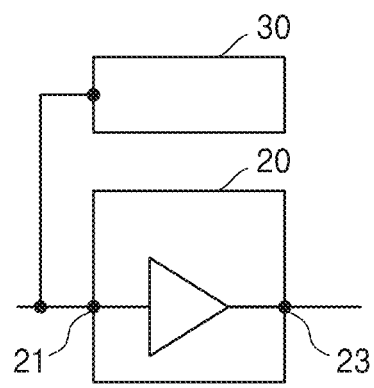
Figure 8C:
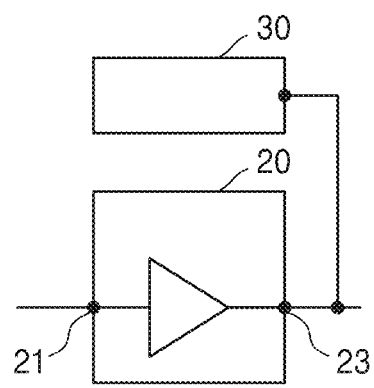

FIG. 8A, FIG. 8B and FIG. 8C are diagrams showing various embodiments of connecting an apparatus for improving circuit health to a circuit to be analyzed.

Referring to FIG. 8A, the apparatus 30 for improving circuit health may be connected to both the input port 21 and the output port 29 of a circuit 20 to be analyzed. The apparatus 30 for improving circuit health may obtain an S-parameter plot by measuring any one or more of the reflection coefficient $S_{11}$ of the input port 21, the reverse transfer coefficient $S_{12}$, the transfer coefficient $S_{21}$, and the reflection coefficient $S_{22}$ of the output port 29 and estimate the health of the circuit 20 to be analyzed based thereon.

Referring to FIG. 8B, the apparatus 30 for improving circuit health may be connected to the input port 21 of the circuit 20 to be analyzed. The apparatus 30 for improving circuit health may obtain a plot of the reflection coefficient $S_{11}$ of the input port 21, which is a ratio between a reflected wave and an incident wave of the input port 21, and estimate the health of the circuit 20 to be analyzed based thereon.

Referring to FIG. 8C, the apparatus 30 for improving circuit health may be connected to the output port 29 of the circuit 20 to be analyzed. The apparatus 30 for improving circuit health may obtain a plot of the reflection coefficient $S_{22}$ of the output port 29, which is a ratio between a reflected wave and an incident wave of the output port 29, and estimate the health of the circuit 20 to be analyzed based thereon.

Figure 9:
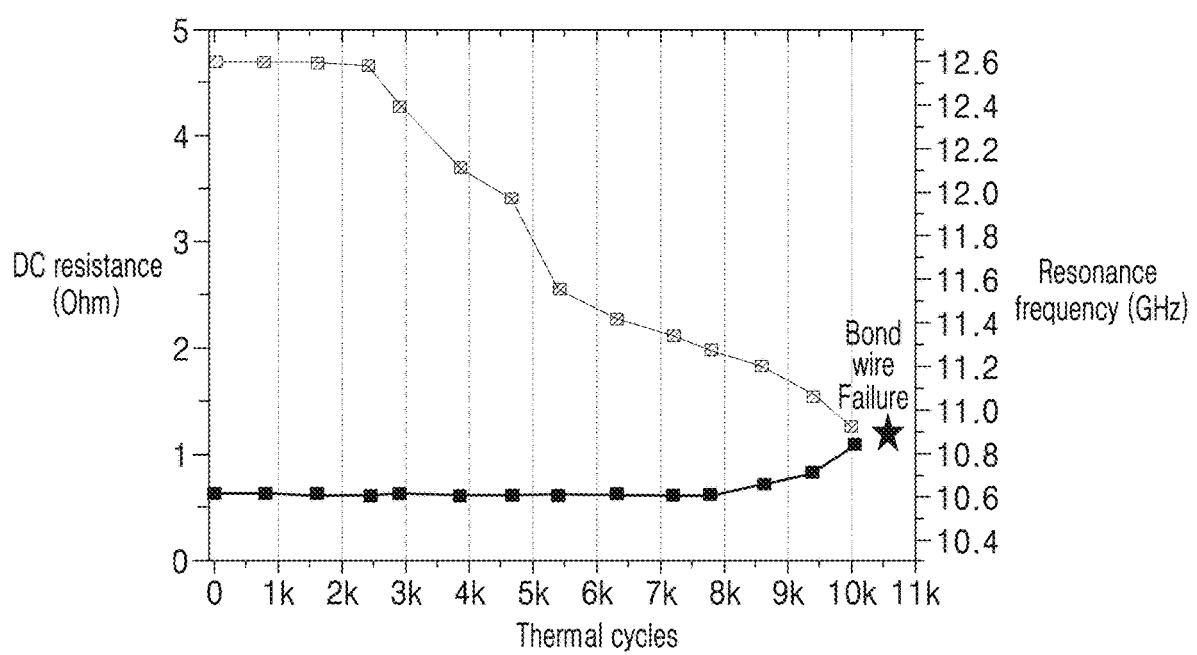
FIG. 9 is a graph showing a change in the resistance and a change in the resonance frequency Fp of a circuit to be analyzed when a thermal stimulation is repeatedly applied thereto.

FIG. 9 is a graph showing a change in the resistance and a change in the resonance frequency Fp of a circuit to be analyzed when a thermal stimulation is repeatedly applied thereto.

Referring to FIG. 9, it may be seen that, when a thermal stimulation is repeatedly applied to the circuit to be analyzed, the resistance of the circuit to be analyzed does not change significantly until a wire bonding is completely destroyed and the circuit to be analyzed malfunctions. On the other hand, it may be seen that the resonance frequency Fp of the circuit to be analyzed decreases from a time point at which the $2500^{th}$ thermal stimulation is applied to the circuit to be analyzed and exhibits a significant change until a time point at which the wire bonding is destroyed.

Therefore, by obtaining an S-parameter plot of the circuit to be analyzed and measuring a change in the resonance frequency thereof, the damage to the circuit to be analyzed may be traced from the beginning, and, by quantifying the same, the circuit to be analyzed may be repaired or repaired before the circuit to be analyzed fails, thereby improving the reliability of an electronic device including the circuit to be analyzed.

Figure 10:
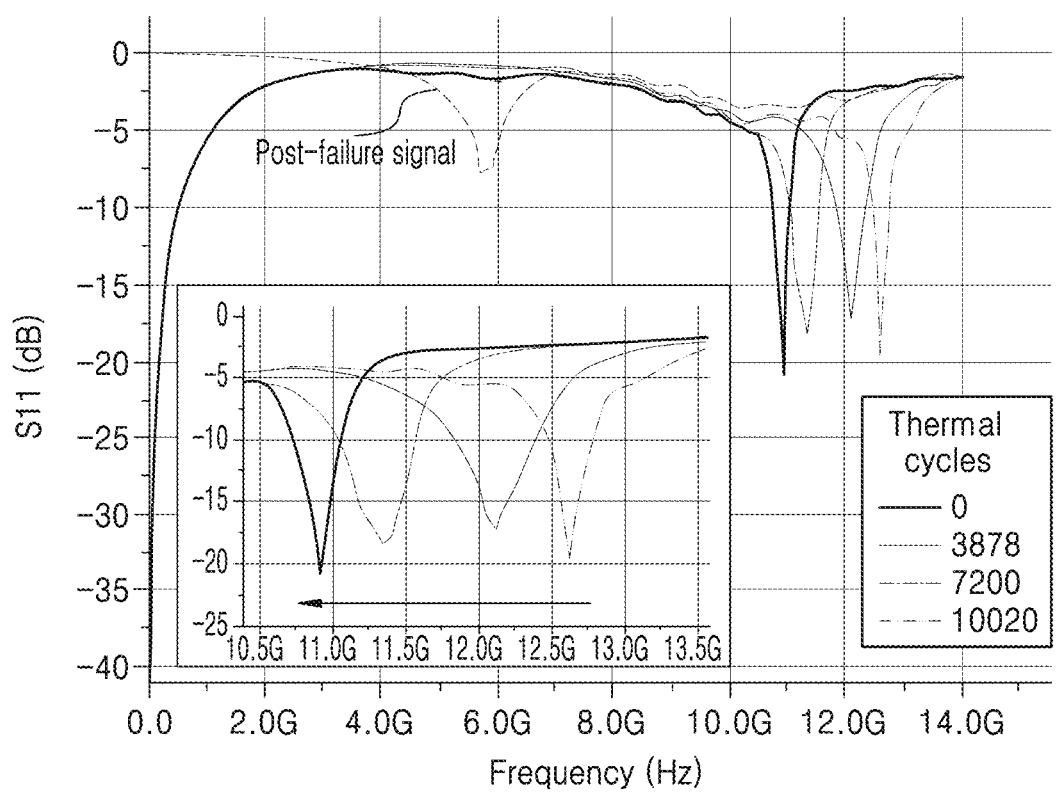
FIG. 10 is a graph showing a change in S-parameter plot data of a circuit to be analyzed when a thermal stimulation is repeatedly applied.

FIG. 10 is a graph showing a change in S-parameter plot data of a circuit to be analyzed when a thermal stimulation is repeatedly applied.

FIG. 10 shows a plot of the reflection coefficient $S_{11}$ obtained by measuring a ratio between a reflected wave and an incident wave at an input port of a circuit to be analyzed according to an embodiment. The S-parameter plot has a resonance frequency Fp that is a local minimum in the frequency range from 5 GHz to 14.0 GHz.

When the thermal stimulation is applied to the circuit to be analyzed 0 times, the circuit to be analyzed is in the fresh state, and the first resonance frequency Fp1 is 12.7 GHz.

When the circuit to be analyzed is damaged by the thermal stimulation, the circuit to be analyzed is in the old state, and the second resonance frequency Fp2 is 5.5 GHz.

As the thermal stimulation is repeatedly applied to the circuit to be analyzed, the resonance frequency Fp changes in a direction from the first resonance frequency Fp1 toward the second resonance frequency Fp2. Therefore, based on a ratio of a difference between the first resonance frequency Fp1 and the second resonance frequency Fp2 and a difference between the resonance frequency Fp and the second resonance frequency Fp2, the remaining life of the circuit to be analyzed may be quantitatively measured.

FIG. 11A, FIG. 11B, FIG. 11C and FIG. 11D are scanning electron microscope photographs showing defects occurring in the wire bonding of a circuit to be analyzed when thermal stimulation is repeatedly applied.

Figure 11A:
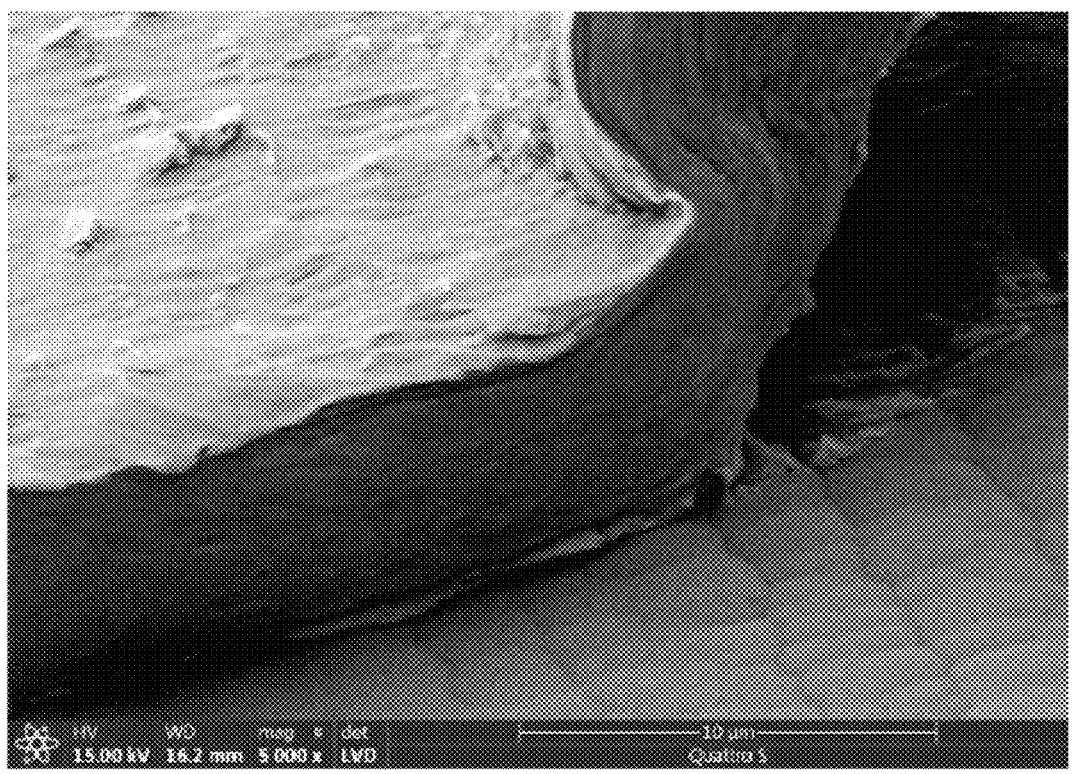
FIG. 11A, FIG. 11B, FIG. 11C and FIG. 11D are scanning electron microscope photographs showing defects occurring in the wire bonding of a circuit to be analyzed when thermal stimulation is repeatedly applied.
Figure 11B:
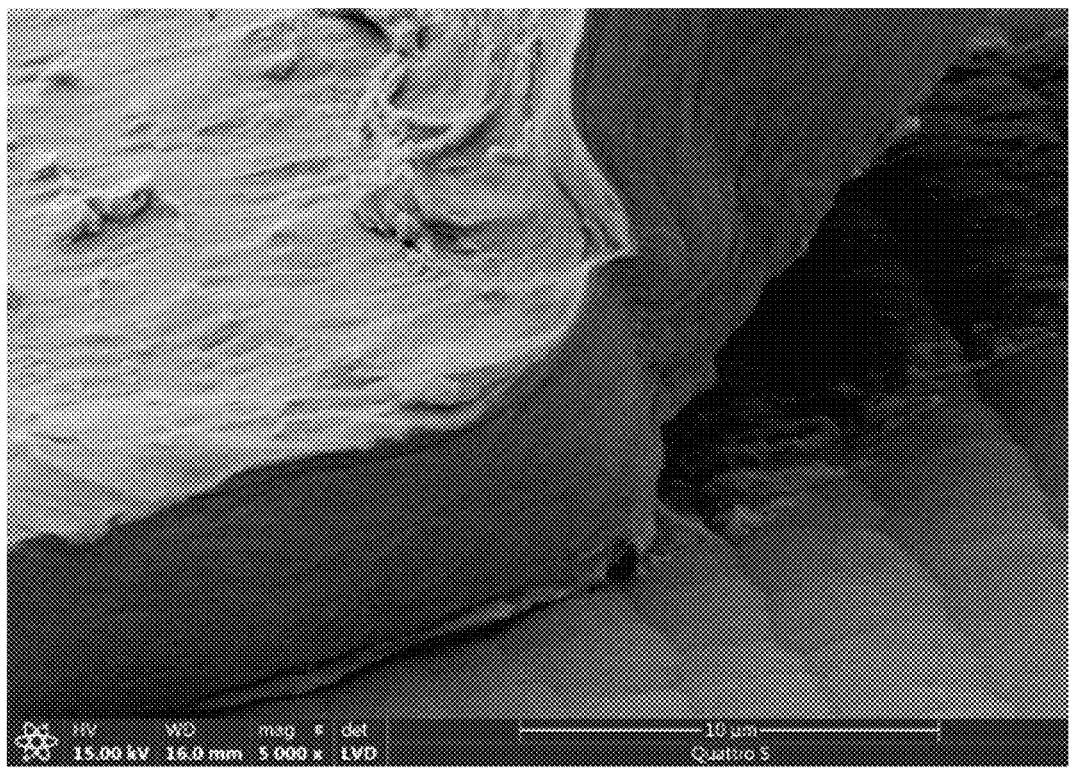
Figure 11C:
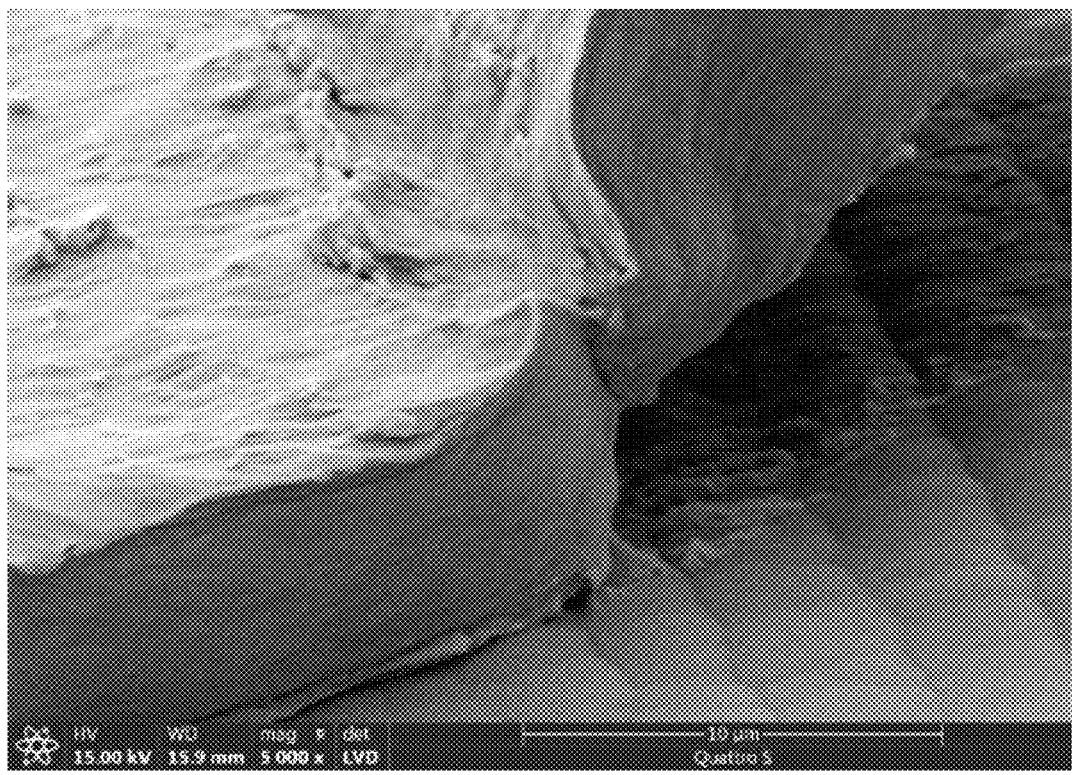
Figure 11D:
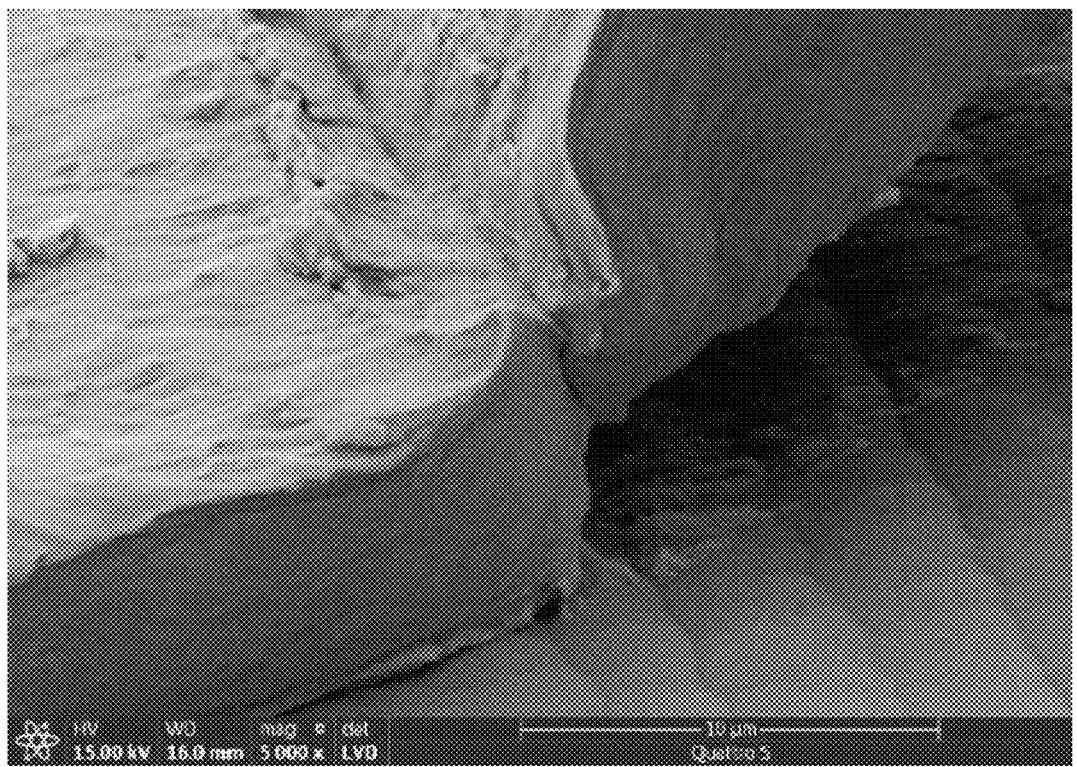

FIG. 11A is a scanning electron microscope photograph of the wire bonding of the circuit to be analyzed before thermal stimulation is applied, FIG. 11B is a scanning electron microscope photograph of the wire bonding when thermal stimulation is applied 5400 times, FIG. 11C is a scanning electron microscope photograph of the wire bonding when thermal stimulation is applied 7200 times, and FIG. 11D is a scanning electron microscope photograph of the wire bonding when thermal stimulation is applied 10020 times.

It may be seen that cracks are formed at junctions of wires due to the repeatedly applied thermal stimulation. When further thermal stimulation is repeatedly applied, disconnection may occur due to deterioration of wires and may cause the complete failure of the circuit to be analyzed.

As it may be seen in FIG. 9, despite the damage to the wires, which can be confirmed by the scanning electron microscope photographs, the resistance of the circuit to be analyzed increased only slightly after the thermal stimulation was applied 8500 times. On the other hand, it was confirmed that the resonance frequency Fp of the S-parameter plot sensitively reflected the damage of the wires and showed a significant change from the beginning.

Figure 12:
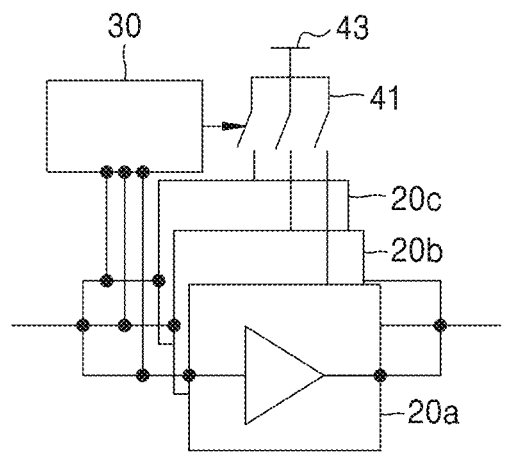
FIG. 12 is a diagram showing an electronic device including an apparatus for improving circuit health according to an embodiment.

FIG. 12 is a diagram showing an electronic device including an apparatus for improving circuit health according to an embodiment.

Referring to FIG. 12, an electronic device includes a plurality of circuits 20a, 20b, and 20c, the apparatus 30 for improving circuit health, a switch circuit 41, and a power supply 43.

The plurality of circuits 20a, 20b, and 20c may include a plurality of identical circuits for driving the electronic device connected in parallel to one another. The plurality of circuits 20a, 20b, and 20c may each include an input port and an output port, and the apparatus 30 for improving circuit health may be connected to the input port, the output port, or both the input port and the output port.

The apparatus 30 for improving circuit health evaluates the circuit health of the plurality of circuits 20a, 20b, and 20c and applies a replacement signal to the switch circuit 41 based thereon.

The apparatus 30 for improving circuit health may select and determine one circuit connected to the system and driven from among the plurality of circuits 20a, 20b, and 20c as a circuit to be analyzed and determine the circuit health of the circuit to be analyzed.

The apparatus 30 for improving circuit health may include a memory, an S-parameter measurer that obtains an S-parameter plot of a circuit to be analyzed having an input port and an output port, and a processor configured to determine the resonance frequency Fp of the circuit to be analyzed based on data regarding the S-parameter plot and estimate the circuit health of the circuit to be analyzed based on the resonance frequency Fp.

The apparatus 30 for improving circuit health may quantitatively estimate the remaining lifespan of the circuit to be analyzed based on the first resonance frequency Fp1 when the circuit to be analyzed is in the fresh state, the second resonance frequency Fp2 when the circuit to be analyzed is in the old state, and the resonance frequency Fp.

The apparatus 30 for improving circuit health applies a replacement command to the switch circuit 41 when the estimated remaining lifespan is equal to or less than a pre-set value. Here, the pre-set value may be a value determined in consideration of the electrical characteristics of a circuit to be analyzed and economic feasibility and efficiency regarding replacement.

The switch circuit 41 may receive a replacement signal applied by the apparatus 30 for improving circuit health and select one of the plurality of circuits 20a, 20b, and 20c. The switch circuit 41 may control a switch for connecting the plurality of circuits 20a, 20b, and 20c to an electronic device or a switch for connecting the plurality of circuits 20a, 20b, and 20c to a power supply for supplying power to the plurality of circuits 20a, 20b, and 20c.

The switch circuit 41 removes an existing connection of a circuit to be analyzed to an electronic device or the power supply 43 according to a replacement command of the apparatus 30 for improving circuit health, selects a new circuit from among the plurality of circuits 20a, 20b, and 20c, and connect the new circuit to the electronic device or the power supply 43.

Figure 13:
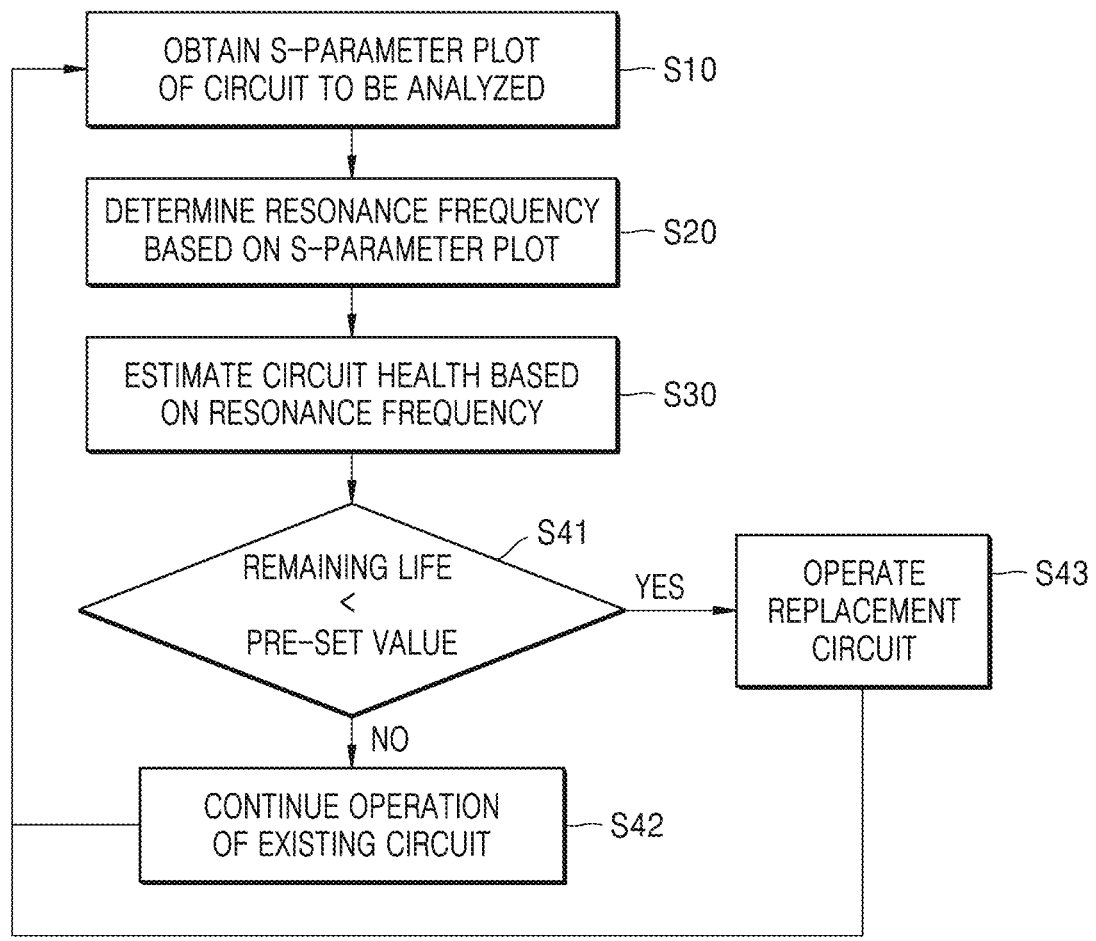
FIG. 13 is a block diagram showing an operation algorithm of the electronic device shown in FIG. 12.

FIG. 13 is a block diagram showing an operation algorithm of the electronic device shown in FIG. 12.

Referring to FIG. 13, the operation algorithm of the electronic device includes operation S10 of obtaining S-parameter plot data, operation S20 of setting a resonance frequency of an existing circuit, operation S30 of estimating circuit health, and operation S40 of determining whether to replace a circuit.

In operation S40 of determining whether to replace a circuit, when the remaining lifespan of an existing circuit is less than a pre-set value, the apparatus 30 for improving circuit health applies a replacement signal to the switch circuit 41, such that any one of circuits 20a, 20b, and 20c operates as a replacement circuit (operation S41). On the other hand, when the remaining lifespan of the existing circuit is greater than the pre-set value, the operation of the existing circuit is continued (operation S42).

A circuit health estimation and replacement algorithm may be repeatedly performed at regular time intervals or cycles.

Figure 14A:
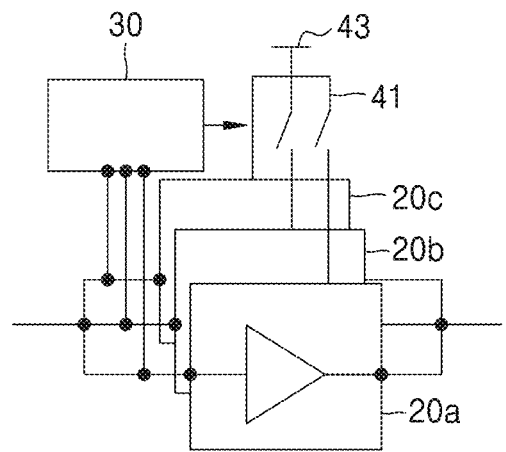
FIG. 14A, FIG. 14B and FIG. 14C are diagrams for describing an operation of the electronic device shown in FIG. 12.
Figure 14B:
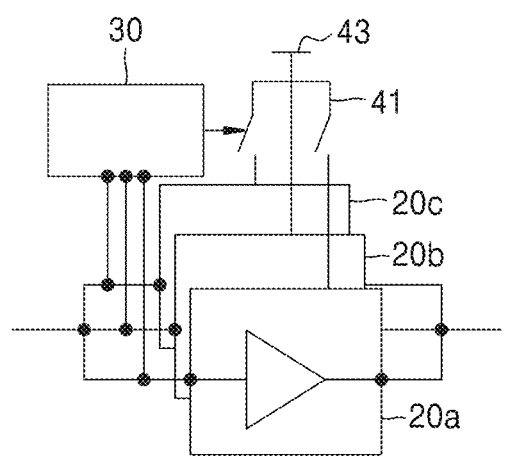
Figure 14C:
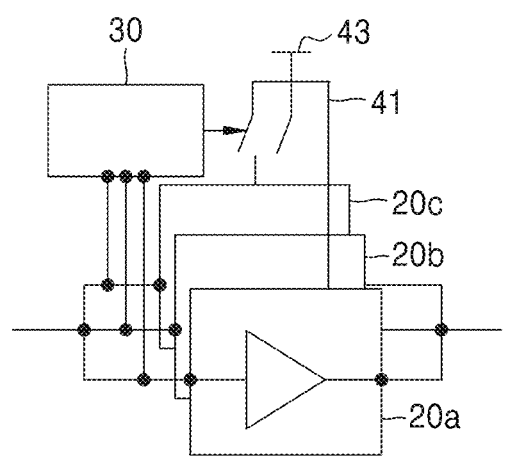

FIG. 14A, FIG. 14B and FIG. 14C are diagrams for describing an operation of the electronic device shown in FIG. 12.

Referring to FIG. 14A, when the electronic device is initially operated, the switch circuit 41 may connect the power supply 43 and a first circuit 20a to drive the electronic device. When the first circuit 20a is degraded due to the driving of the electronic device, the apparatus 30 for improving circuit health determines the circuit health of the first circuit 20a and determines whether to replace the first circuit 20a based on the remaining lifespan.

When the apparatus 30 for improving circuit health determines that the remaining lifespan of the first circuit 20a is less than a pre-set value, the apparatus 30 for improving circuit health may apply a replacement signal to the switch circuit 41.

Referring to FIG. 14B, the switch circuit 41 may receive the replacement signal, remove the connection between the first circuit 20a and the power supply 43, and connects a second circuit 20b to the power supply 43. The electronic device may be driven by using the second circuit 20b.

The apparatus 30 for improving circuit health may periodically determine the circuit health of the second circuit 20b and determine whether to replace the second circuit 20b based on the remaining lifespan.

Referring to FIG. 14C, the switch circuit 41 may receive a replacement signal of the apparatus 30 for improving circuit health, remove the connection between the second circuit 20b and the power supply 43, and connect a third circuit 20c to the power supply 43.

The plurality of circuits 20a, 20b, and 20c, the apparatus 30 for improving circuit health, and the switch circuit 41 may be formed on one substrate or form an embedded system constituting one packaging. In this case, the apparatus 30 for improving circuit health and the plurality of circuits 20a, 20b, and 20c may operate as one circuit, thereby improving the reliability of the electronic device without human judgment or manipulation.

Figure 15A:
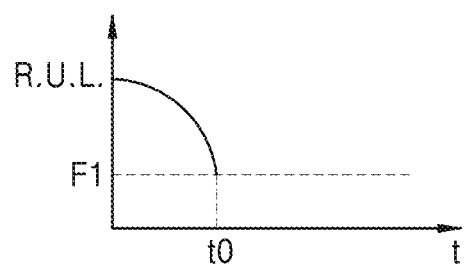
FIG. 15A and FIG. 15B are remaining lifetime-time graphs for describing application of a replacement command by an apparatus for improving circuit health based on the remaining lifespan, according to an embodiment.
Figure 15B:
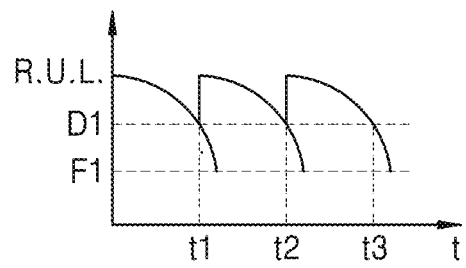

FIG. 15A and FIG. 15B are remaining lifetime-time graphs for describing application of a replacement command by an apparatus for improving circuit health based on the remaining lifespan, according to an embodiment.

Referring to FIG. 15A, it may be confirmed that the remaining lifespan of a circuit decreases with a steep slope near a point F1 and a failure occurs. Therefore, the reliability of an electronic device may be improved by replacing the circuit before the remaining life of the circuit reaches the point F1 at which the probability of a failure or a malfunction is very high.

FIG. 15B shows a graph of the remaining lifespan in the case of applying a replacement signal by selecting a remaining lifespan value D1 before the remaining lifespan of a circuit decreases with a steep slope. The remaining lifespan value D1 may be selected in consideration of electrical characteristics, use environment, and purpose of a circuit and economic feasibility and efficiency regarding replacement of the circuit.

When the remaining lifespan of a circuit reaches D1, the switch circuit 41 applies a replacement signal to remove an existing connection of the circuit and connect a new circuit, thereby minimizing malfunction and failure of an electronic device.

According to a method and an apparatus for improving circuit health according to an embodiment, circuit health is estimated by using a change pattern of an S-parameter plot, thereby discovering and estimating a defect at an earlier stage as compared to a method of measuring resistance generally used for estimating circuit health. Also, since an S-parameter is measured in a high-frequency region, a defect or damage in a small circuit may be more accurately detected as compared to a method of measuring impedance.

Also, by using a first resonance frequency when a circuit to be analyzed is in a fresh state, a second resonance frequency when the circuit to be analyzed is in an old state, and a current resonance frequency of the circuit to be analyzed, the remaining lifespan of the circuit to be analyzed may be quantitatively estimated.

When the remaining lifespan of a circuit to be analyzed is less than or equal to a pre-set value, an electronic device according to an embodiment selects any one of a plurality of circuits connected in parallel and replaces the circuit to be analyzed with a selected circuit, thereby preventing a failure of the electronic device due to a failure of the circuit to be analyzed. Therefore, the reliability of the entire electronic device may be improved.

A method, an apparatus, and an electronic device according to one or more embodiments may be applied to parts, devices, or systems that are packaged and difficult or time-consuming to be partially repaired or replaced. Therefore, not only improvement of reliability of components, devices, or systems, but also synergistic effects like improvement of operation rate, improvement of quality, improvement of productivity, and improvement of energy efficiency may be expected.

The technical effects of one or more embodiments are not limited to those mentioned above, and other technical effects not mentioned will be clearly understood by one of ordinary skill in the art from the following description.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure as defined by the following claims.

What is claimed is:

1. A method of estimating health of a circuit by using an S-parameter plot analysis of an apparatus comprising a memory, an S-parameter measurer, and at least one processor, the method comprising:
   obtaining, by the S-parameter measurer, an S-parameter plot of a circuit having an input port and an output port;
   determining, by the at least one processor, a resonance frequency of the circuit based on the S-parameter plot, wherein the resonance frequency has a maximum or a minimum in a pre-set frequency band; and estimating, by the at least one processor, a remaining lifespan of the circuit based on a ratio of a difference between the resonance frequency and a second resonance frequency to a difference between a first resonance frequency and the second resonance frequency, wherein the S-parameter measurer obtains and saves in the memory the first resonance frequency of the circuit when the circuit is in a fresh state, and obtains and saves in the memory the second resonance frequency of the circuit when the circuit is in an old state.

2. The method of claim 1, wherein the S-parameter measurer obtains the second resonance frequency after the circuit underwent a pre-set number of chemical, physical, or thermal stimulations.

3. The method of claim 1, wherein the obtaining of the S-parameter plot of the circuit comprises obtaining a plot regarding a reflection coefficient, which is a ratio of a reflected wave to an incident wave of the input port.

4. The method of claim 1, wherein the obtaining of the S-parameter plot of the circuit comprises obtaining a plot regarding a reverse transfer coefficient, which is a ratio of the reflected wave of the input port to an incident wave of the output port.

5. The method of claim 1, wherein the obtaining of the S-parameter plot of the circuit comprises obtaining a plot regarding a transfer coefficient, which is a ratio of a reflected wave of the output port to an incident wave of the input port.

6. The method of claim 1, wherein the obtaining of the S-parameter plot of the circuit comprises obtaining a plot regarding a reflection coefficient, which is a ratio of the reflected wave to the incident wave of the output port.

7. An apparatus for estimating health of a circuit to be analyzed by using an S-parameter plot analysis, the apparatus comprising:
a memory;
an S-parameter measurer configured to obtain an S-parameter plot of a circuit to be analyzed having an input port and an output port and store data regarding the S-parameter plot in the memory; and
at least one processor configured to determine a resonance frequency of the circuit to be analyzed based on the data regarding the S-parameter plot stored in the memory and estimate a remaining lifespan of the circuit to be analyzed based on the resonance frequency
wherein the processor is further configured to determine a first resonance frequency when the circuit to be analyzed is in a fresh state, and a second resonance frequency when the circuit to be analyzed is in an old state, and
the remaining lifespan of the circuit to be analyzed is estimated based on a ratio of a difference between the resonance frequency and the second resonance frequency to a difference between the first resonance frequency and the second resonance frequency.

8. The apparatus of claim 7, wherein the second resonance frequency is a resonance frequency of the circuit to be analyzed obtained by repeatedly applying a chemical, physical, or thermal stimulation to the circuit for a pre-set number of times.

9. The apparatus of claim 7, wherein the resonance frequency of the circuit to be analyzed is a frequency having a maximum or a minimum in a pre-set frequency band in the S-parameter plot of the circuit to be analyzed.

10. An electronic device comprising:
a plurality of circuits connected in parallel;
an apparatus for improving circuit health, wherein the apparatus is configured to evaluate circuit health of the plurality of circuits and apply a replacement signal based on an evaluation result;
a switch circuit configured to receive the replacement signal and select one of the plurality of circuits; and
a power supply configured to supply power to one circuit selected by the switch circuit,
wherein the apparatus for improving circuit health comprises:
a memory;
an S-parameter measurer configured to obtain an S-parameter plot of a circuit to be analyzed having an input port and an output port and store data regarding the S-parameter plot in the memory; and
at least one processor configured to determine a resonance frequency of the circuit to be analyzed based on the data regarding the S-parameter plot stored in the memory and estimate health of the circuit to be analyzed based on the resonance frequency,
wherein the processor is further configured to determine a first resonance frequency when the circuit to be analyzed is in a fresh state, and a second resonance frequency when the circuit to be analyzed is in an old state, and
the remaining lifespan of the circuit to be analyzed is estimated based on a ratio of a difference between the resonance frequency and the second resonance frequency to a difference between the first resonance frequency and the second resonance frequency,
when the remaining lifespan of the circuit to be analyzed is less than or equal to a pre-set value, the apparatus for improving circuit health applies a replacement command to the switch circuit.

* * * * *